US011621043B2

(12) United States Patent
Barndt et al.

(10) Patent No.: US 11,621,043 B2
(45) Date of Patent: *Apr. 4, 2023

(54) READ LEVEL TRACKING AND OPTIMIZATION

(71) Applicant: Western Digital Technologies, Inc., San Jose, CA (US)

(72) Inventors: Richard David Barndt, San Diego, CA (US); Aldo Giovanni Cometti, San Diego, CA (US); Richard Leo Galbraith, Rochester, MN (US); Jonas Andrew Goode, Lake Forest, CA (US); Niranjay Ravindran, Rochester, MN (US); Anthony Dwayne Weathers, San Diego, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/359,352

(22) Filed: Jun. 25, 2021

(65) Prior Publication Data

US 2021/0319837 A1 Oct. 14, 2021

Related U.S. Application Data

(63) Continuation of application No. 16/921,804, filed on Jul. 6, 2020, now Pat. No. 11,101,006, which is a (Continued)

(51) Int. Cl.
*G11C 16/34* (2006.01)
*G06F 3/06* (2006.01)
(Continued)

(52) U.S. Cl.
CPC ........ *G11C 16/3427* (2013.01); *G06F 3/0656* (2013.01); *G06F 3/0679* (2013.01); (Continued)

(58) Field of Classification Search
CPC ..................................................... G11C 16/34
See application file for complete search history.

(56) References Cited

U.S. PATENT DOCUMENTS 9,390,002 B1 7/2016 Lee
9,633,740 B1 4/2017 Alhussien et al.
(Continued)

*Primary Examiner* — Min Huang
(74) *Attorney, Agent, or Firm* — Morgan, Lewis & Bockius LLP

(57) ABSTRACT

Systems and methods for read level tracking and optimization are described. Pages from a wordline of a flash memory device read and the raw page data read from the wordline may be buffered in a first set of buffers. The raw page data for each of the pages may be provided to a decoder for decoding and the decoded page data for each of the pages buffered in a second set of buffers. First bin identifiers may be identified for memory cells of the wordline based on the raw page data and second bin identifiers may be identified for the memory cells of the wordline based on the decoded page data. Cell-level statistics may be accumulated based on the first bin identifiers and the second bin identifiers, and a gradient may be determined for respective read levels based on decoding results for each of the pages and the cell-level statistics. Settings for the read levels may be configured in the flash memory device based on the determined gradients.

20 Claims, 8 Drawing Sheets

Related U.S. Application Data continuation of application No. 16/354,039, filed on Mar. 14, 2019, now Pat. No. 10,748,628, which is a continuation of application No. 15/665,200, filed on Jul. 31, 2017, now Pat. No. 10,236,070.

(60) Provisional application No. 62/525,677, filed on Jun. 27, 2017.

(51) Int. Cl.
  G11C 11/56 (2006.01)
  G11C 29/02 (2006.01)
  G06F 11/10 (2006.01)

(52) U.S. Cl.
  CPC ...... *G06F 11/1072* (2013.01); *G11C 11/5642* (2013.01); *G11C 16/3486* (2013.01); *G11C 16/3495* (2013.01); *G11C 29/021* (2013.01); *G11C 29/028* (2013.01); *G11C 2211/5644* (2013.01)

(56) References Cited

U.S. PATENT DOCUMENTS

| | | | |
|---|---|---|---|
| 10,083,754 B1* | 9/2018 | Chen | G11C 7/1006 |
| 10,236,070 B2* | 3/2019 | Barndt | G11C 16/3495 |
| 10,748,628 B2* | 8/2020 | Barndt | G11C 16/3427 |
| 11,101,006 B2* | 8/2021 | Barndt | G11C 11/5642 |
| 2011/0069521 A1 | 3/2011 | Elfadel | |
| 2012/0236641 A1 | 9/2012 | Hu | |
| 2013/0229867 A1* | 9/2013 | Tang | G11C 16/26 365/185.2 |
| 2013/0290612 A1 | 10/2013 | Weathers et al. | |
| 2013/0318422 A1 | 11/2013 | Weathers et al. | |
| 2014/0204671 A1 | 7/2014 | Sharon et al. | |
| 2015/0085571 A1* | 3/2015 | Hu | G11C 11/5642 365/185.21 |
| 2016/0147582 A1 | 5/2016 | Karakulak | |
| 2016/0148701 A1 | 5/2016 | Karakulak | |
| 2016/0148702 A1 | 5/2016 | Karakulak | |

\* cited by examiner

READ LEVEL TRACKING AND OPTIMIZATION

CROSS-REFERENCE TO RELATED APPLICATIONS

This application is a continuation of application Ser. No. 16/921,804, filed on Jul. 6, 2020, now U.S. Pat. No. 11,101,006, which is a continuation of application Ser. No. 16/354,039, filed on Mar. 14, 2019, now U.S. Pat. No. 10,748,628, which is a continuation of application Ser. No. 15/665,200, filed Jul. 31, 2017, now U.S. Pat. No. 10,236,070, which claims the benefit of U.S. Provisional Application No. 62/525,677, filed Jun. 27, 2017, the entirety of each of which is incorporated herein by reference for all purposes.

BACKGROUND

Flash memory cells are programmed by trapping electrons on a floating gate, which increases the threshold voltage of the memory cells to a level corresponding to a desired program level. Data is subsequently read from the flash memory cells by applying read level voltages to the flash memory cells to determine the respective program levels to which the flash memory cells were programmed. As flash memory systems age, distributions of the flash memory cells within the different program levels may widen and shift relative to the read level voltages used to read the flash memory cells. These changes to the distributions may increase read error rates and possibly result in the loss of data.

SUMMARY

According to aspects of the subject disclosure, a method for read level tracking and adjustment is provided. The method includes reading a plurality of pages from a wordline of a flash memory device and buffering raw page data read from the wordline for each of the plurality of pages in a first set of buffers. The method further includes providing the raw page data for each of the plurality of pages to a decoder for decoding and buffering decoded page data from the decoder for each of the plurality of pages in a second set of buffers. A first plurality of bin identifiers for memory cells of the wordline is identified based on the raw page data buffered in the first set of buffers and a second plurality of bin identifiers for the memory cells of the wordline is identified based on the decoded page data buffered in the second set of buffers. Cell-level statistics are accumulated based on the first plurality of bin identifiers and the second plurality of bin identifiers and a gradient is determined for each of a plurality of read levels based on decoding results for each of the plurality of pages and the cell-level statistics. Settings for the plurality of read levels are configured in the flash memory device based on the determined gradients.

According to aspects of the subject disclosure, a processor-readable storage medium encoded with instructions that, when executed by a processor, cause the processor to perform a method is provided. The method includes reading a plurality of pages from a wordline of a flash memory device and buffering raw page data read from the wordline for each of the plurality of pages in a first set of buffers. The method further includes providing the raw page data for each of the plurality of pages to a decoder for decoding and buffering decoded page data from the decoder for each of the plurality of pages in a second set of buffers. A first plurality of bin identifiers for memory cells of the wordline is identified based on logical values corresponding to the respective memory cells in the raw page data buffered in the first set of buffers, and a second plurality of bin identifiers for the memory cells of the wordline is identified based on logical values corresponding to the respective memory cells in the decoded page data buffered in the second set of buffers. Cell-level statistics are accumulated based on the first plurality of bin identifiers and the second plurality of bin identifiers and a gradient is determined for each of a plurality of read levels based on decoding results for each of the plurality of pages and the cell-level statistics. Settings for the plurality of read levels are configured in the flash memory device based on the determined gradients.

According to aspects of the subject disclosure, a data storage system is provided that includes a flash memory device comprising a plurality of wordlines, a first set of buffers, a second set of buffers, and a controller. The controller is configured to read a plurality of pages from a wordline of the plurality of wordlines in the flash memory device and buffer raw page data read from the wordline for each of the plurality of pages in the first set of buffers. The controller is further configured to provide the raw page data for each of the plurality of pages to a decoder for decoding and buffer decoded page data from the decoder for each of the plurality of pages in the second set of buffers. The controller is further configured to identify a first plurality of bin identifiers for memory cells of the wordline based on the raw page data buffered in the first set of buffers and identify a second plurality of bin identifiers for the memory cells of the wordline based on the decoded page data buffered in the second set of buffers. The controller is further configured to accumulate cell-level statistics based on the first plurality of bin identifiers and the second plurality of bin identifiers and determine a gradient comprising a magnitude and a direction for each of a plurality of read levels based on decoding results for each of the plurality of pages and the cell-level statistics. The controller is further configured to configure settings for the plurality of read levels in the flash memory device based on the determined gradients.

According to aspects of the subject disclosure, a data storage system is provided that includes a flash memory device comprising a plurality of wordlines, a first set of buffers, and a second set of buffers. The data storage system further includes means for identifying a first plurality of bin identifiers for memory cells of a wordline of the plurality of wordlines based on raw page data read from the wordline for each of a plurality of pages buffered in the first set of buffers. The data storage system further includes means for identifying a second plurality of bin identifiers for the memory cells of the wordline based on page data decoded from the raw page data and buffered in the second set of buffers. The data storage system further includes means for accumulating cell-level statistics based on the first plurality of bin identifiers and the second plurality of bin identifiers and means for determining a gradient for each of a plurality of read levels based on decoding results for each of the plurality of pages and the cell-level statistics. The data storage system further includes means for configuring settings for the plurality of read levels in the flash memory device based on the determined gradients.

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

DETAILED DESCRIPTION

The detailed description set forth below is intended as a description of various configurations of the subject disclosure and is not intended to represent the only configurations in which the subject disclosure may be practiced. The appended drawings are incorporated herein and constitute a part of the detailed description. The detailed description includes specific details for the purpose of providing a thorough understanding of the subject disclosure. However, it will be apparent to those skilled in the art that the subject disclosure may be practiced without these specific details. In some instances, structures and components are shown in block diagram form in order to avoid obscuring the concepts of the subject disclosure. Like components are labeled with identical element numbers for ease of understanding.

The subject technology is directed to the tracking and optimization of read levels in flash memory systems. As discussed in detail below, the subject technology implements a read level adjustment control loop during which read levels are periodically evaluated using statistics gathered during read operations and gradients for adjusting the read levels are determined based on the statistics. The determined gradients provide a magnitude and direction for adjusting the respective read levels closer to optimal levels during each iteration.

Figure 1:
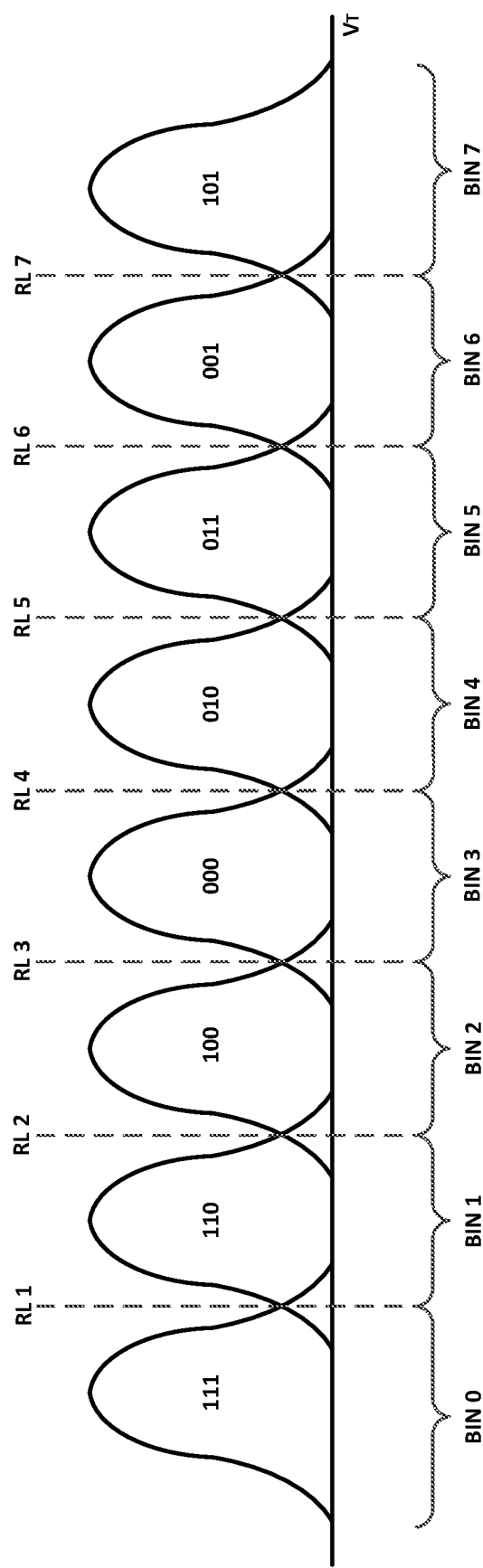
FIG. 1 is a diagram illustrating program level distributions of flash memory cells according to aspects of the subject technology.

FIG. 1 is a diagram illustrating program level distributions of flash memory cells according to aspects of the subject technology. FIG. 1 illustrates the distributions of eight program levels in a triple-level cell (TLC) flash memory device. The eight program level distributions are identified in FIG. 1 by logical values corresponding to the respective program levels. In the illustrated example, the logical values corresponding to the respective program levels include "111", "110", "100", "000", "010", "011", "001", and "101". The logical values represent an upper bit, a middle bit, and a lower bit of data values stored in flash memory cells programmed to the respective program levels.

As further illustrated in FIG. 1, seven read levels are indicated with dashed vertical lines. The read levels include RL1, RL2, RL3, RL4, RL5, RL6, and RL7. These read levels represent voltage levels applied to the flash memory cells to determine the program level to which each flash memory cell has been programmed. The read levels are depicted as being placed at the intersections of the program level distributions. The portions of a particular program level distribution that cross the read levels represent read errors. For example, flash memory cells in the portion of the program level distribution corresponding to "111" that crosses the RL1 read level may be mistakenly read as being part of the program level distribution corresponding to "110". Keeping the read levels at or near the program level distribution crossing points helps minimize these read errors. Tracking the amounts of these types of read errors may be used to evaluate and adjust the read level voltages as discussed in more detail below.

Also illustrated in FIG. 1 are eight bins identified as BIN 0, BIN 1, BIN 2, BIN 3, BIN 4, BIN 5, BIN 6, and BIN 7. Each of these bins represents a range of threshold voltages to which the flash memory cells may be programmed. For example, all flash memory cells having a threshold voltage less than or equal to the RL 1 voltage may be identified as being in BIN 0. Similarly, all flash memory cells having a threshold voltage greater than the RL 1 voltage and less than or equal to the RL 2 voltage may be identified as being in BIN 1. BIN 2 through BIN 7 are determined in the same manner using the respective read level voltages that bound the respective bins. When data read from the flash memory cells is not decodable, the subject technology utilizes counts of flash memory cells in each of the bins to evaluate and adjust the read level voltages as discussed in more detail below.

Figure 2:
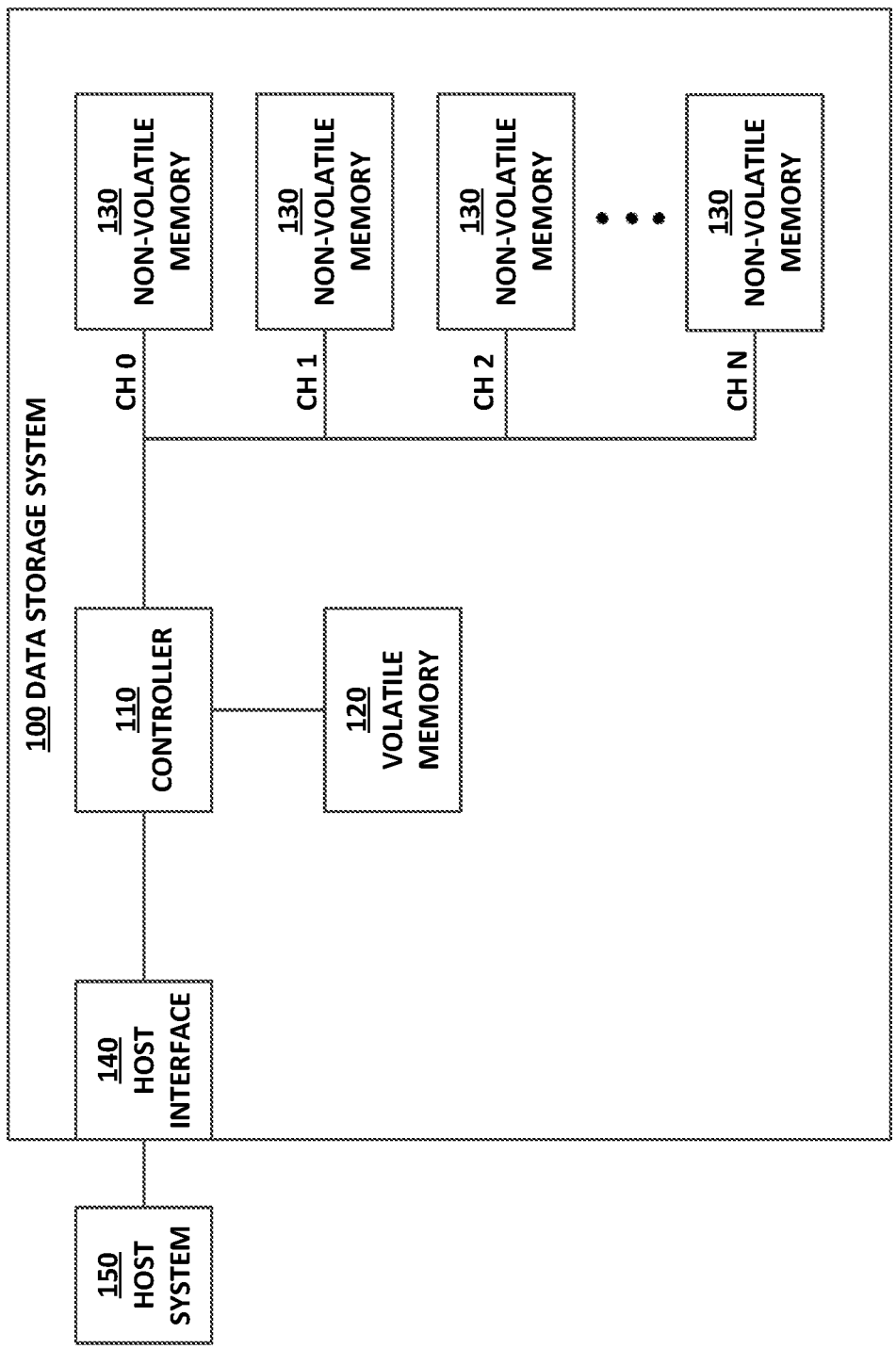
FIG. 2 is a block diagram illustrating components of a data storage system according to aspects of the subject technology.

FIG. 2 is a block diagram illustrating components of a data storage system 100 according to aspects of the subject technology. As depicted in FIG. 2, data storage system 100 includes controller 110, volatile memory 120, non-volatile memory 130, and host interface 140. Controller 110 is configured to process requests received from host system 150 via host interface 140 to access data in non-volatile memory 130. The data access requests received from host system 150 may include write requests to store host data in non-volatile memory 130, read requests to retrieve host data stored in non-volatile memory 130, and erase requests to erase host data stored in non-volatile memory 130. Other types of requests, such as status requests or device management requests, may be received from host system 150 and processed by controller 110.

Host interface 140 is configured to couple host system 150 to data storage system 100. Host interface 140 may include electrical and physical connections for operably coupling host system 150 to controller 110. Via the electrical and physical connections, host interface 140 is configured to communicate data, addresses, and control signals between host system 150 and controller 110. Controller 110 is configured to store host data received from host system 150 in non-volatile memory 130 in response to a write request received from host system 150, and to read host data stored in non-volatile memory 130 and to transfer the read host data to host system 150 via host interface 140 in response to a read request received from host system 150.

Host interface 140 may implement standard interfaces including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe). However, the subject technology is not limited to the use of standard interfaces and may utilize custom or proprietary interfaces for communications with host system 150.

Host system 150 represents any device configured to be coupled to and communicate with data storage system 100 via host interface 140 to store and retrieve data in data storage system 100. Host system 150 may be a computing device such as a personal computer, a server, a workstation, a laptop computer, a smart phone, and the like. Alternatively, host system 150 may be an electronic device such as a digital camera, a digital audio player, a digital video recorder, and the like.

Controller 110 is configured to monitor and control the operation of components of data storage system 100 in response to requests received from host system 150 and during execution of internal maintenance operations. Controller 110 may include a multi-core processor, a general-purpose microprocessor, a microcontroller, a digital signal processor (DSP), an application specific integrated circuit (ASIC), a field programmable gate array (FPGA), a programmable logic device (PLD), a state machine, gated logic, discrete hardware components, or a combination of the foregoing. In some aspects, one or more components of controller 110 may be integrated into a single chip or module, or may be implemented in two or more discrete chips or modules.

Volatile memory 120 represents memory used by controller 110 to temporarily store data and information used to manage data storage system 100. For example, controller 110 may use volatile memory 120 as buffers for host data waiting to be written to non-volatile memory 130 or host data read from non-volatile memory 130 waiting to be transferred to host system 150 or written back to non-volatile memory 130. Controller 120 also may use volatile memory 120 as buffers for raw page data and decoded page data for using in the tracking and adjustment of read levels according to the subject technology described herein. Controller 110 also may store various types of system data used in the management of data storage system 100 in volatile memory 120. The system data may include tables mapping logical addresses referenced by host system 150 to physical addresses of non-volatile memory 130, program/erase (P/E) cycle counts, error statistics, valid/invalid data counts, etc. Controller 110 may store some or all of the data and information described above in non-volatile memory 130, or another form of non-volatile memory not shown, so as to preserve the data and information when data storage system 100 is shut down or otherwise loses power. Controller 110 may periodically store copies of the data and information in non-volatile memory 130 or may wait for a shutdown or power-loss event to back up the data and information in non-volatile memory 130.

Volatile memory 120 may be a random-access memory (RAM) such as static RAM (SRAM) or dynamic RAM (DRAM). However, the subject technology is not limited to any particular type of RAM. In addition, volatile memory 120 may be implemented using a single RAM module or multiple RAM modules. While volatile memory 120 is depicted as being distinct from controller 110, portions or all of volatile memory 120 may be incorporated into controller 110.

As depicted in FIG. 2, multiple non-volatile memory devices 130 are arranged in multiple channels. For example, FIG. 2 illustrates each of N channels having one non-volatile memory device 130. Each of the non-volatile memory devices 130 may include a single die or multiple die. Each die may include an array of non-volatile memory cells, such as NAND flash memory cells, where each cell may be used to store one or more bits of data. For purposes of this description, the flash memory cells are configured to store three bits of data per cell in a triple-level cell (TLC) configuration. However, the subject technology is not limited to this configuration and may be implemented in systems configured to store two bits of data per cell in a multi-level cell (MLC) configuration, four bits per cell in a quad-level cell (QLC) configuration, etc. Each of the non-volatile memory devices 130 may be implemented in respective chips or packages. While each channel is depicted as having a single non-volatile memory device 130, the subject technology may include implementations in which each channel includes two or more non-volatile memory devices 130.

The flash memory cells of a die may be arranged in physical blocks, with each block containing multiple worldlines. Each wordline includes a number of memory cells (e.g., 1 k, 2 k, 4 k, etc.). Depending on the number of bits stored per cell, multiple pages of data may be stored in each wordline. For example, in TLC flash memory three pages of data may be stored in each wordline. The subject technology is not limited to any particular number of wordlines in each physical block. For example, each block may contain 8 wordlines, 16 wordlines, 32 wordlines, etc. Furthermore, the number of physical blocks contained in each flash memory die is not limited to any particular number. In NAND flash memory, the page of a wordline, or the wordline as a whole, represents the smallest unit available for writing data to the flash memory die or reading data from the flash memory die. Physical blocks represent the smallest unit available for erasing data in the flash memory die.

Controller 110 is configured to communicate commands, control information, addresses, data, etc. with the flash memory die via the respective flash memory channels 0-N. Each channel may represent one or more buses configured to communicate electrical signals encoded with commands, control information, addresses, and/or data between controller 110 and the flash memory die coupled to the respective flash memory channel. The subject technology is not limited to any particular number of flash memory channels. For example, data storage system 100 may include 8 channels, 16 channels, 32 channels, etc., without departing from the scope of the subject technology.

Figure 3:
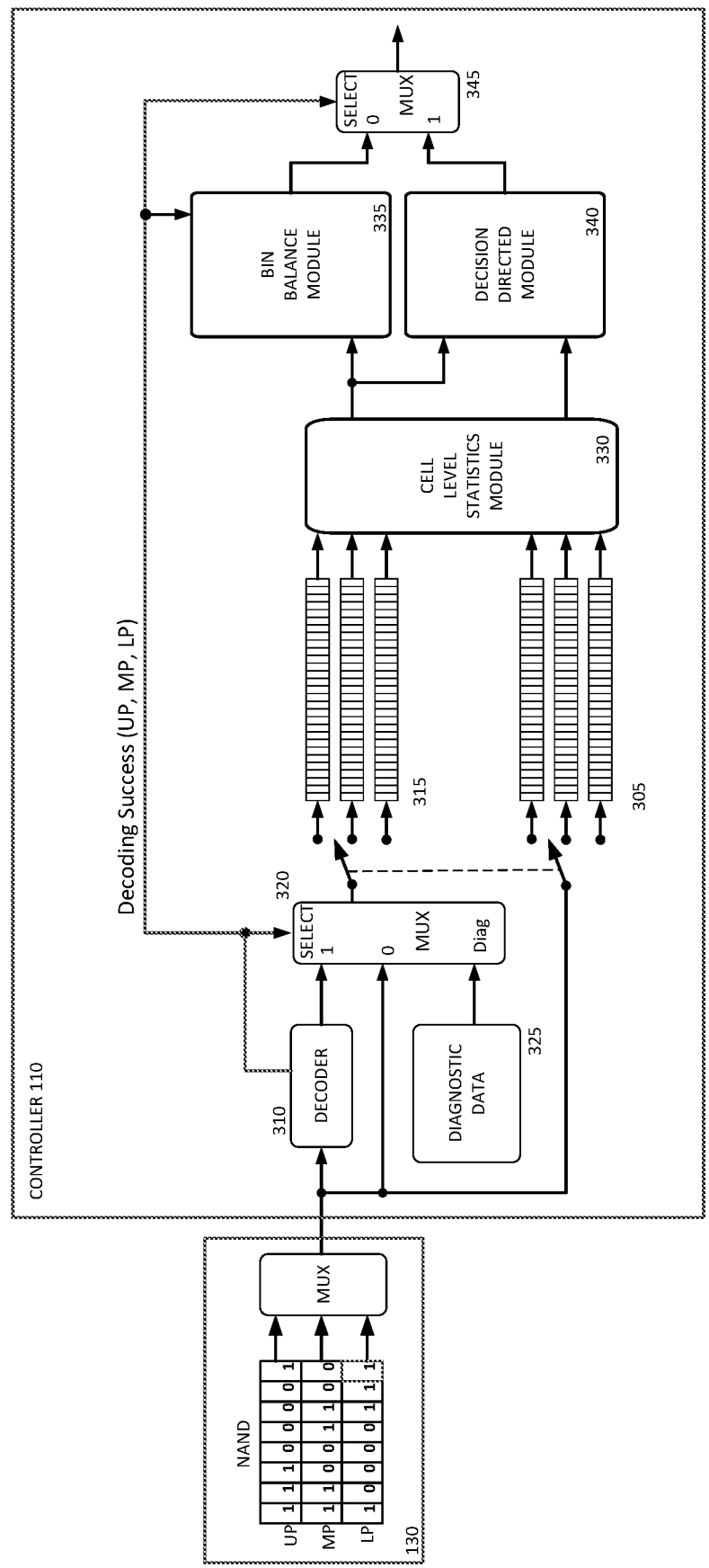
FIG. 3 is a block diagram illustrating data flow for read level tracking and adjustment according to aspects of the subject technology.

FIG. 3 is a block diagram illustrating data flow for read level tracking and adjustment according to aspects of the subject technology. In particular, FIG. 3 illustrates the flow of page data read from non-volatile memory 130 and received by controller 110 for processing according to the methods described herein. Briefly, raw page data is read from a wordline for each page stored in the wordline (e.g., upper page, middle page, lower page) and buffered in a first set of buffers 305. The raw page data is provided to decoder 310 for decoding and decoded page data is buffered from decoder 310 in a second set of buffers 315. Selection logic 320 may be used to store the raw page data in the second set of buffers in the event that decoding of one or more of the pages is unsuccessful, as indicated by a decoding success signal from decoder 310, or know data values from diagnostic data 325 for a diagnostic mode of operation.

The raw page data buffered in the first set of buffers 305 and the decoded page data buffered in the second set of buffers 315 is provided to cell level statistics module 330 for processing. In particular, cell level statistics module 330 processes the raw page data and the decoded page data to accumulate cell-level statistics for use in determining gradients to adjust the read levels, as described in more detail below. The cell level statistics are provided from the cell level statistics module 330 to the bin balance module 335 and the decision directed module 340 to determine gradients based on a bin balance algorithm and a decision directed algorithm, respectively. Selection logic 345 is then used to select gradients from the two different algorithms for each of the read levels based on the decoding success signal indicating which of the pages were successfully decoded and which of the pages were not. The gradients selected from the two algorithms are used to configure settings in non-volatile memory 130 for the read levels. A read level tracking module may manage the process and issue commands to non-volatile memory 130 to configure the read level settings. This process will be described in further detail below.

In addition to the components depicted in FIG. 3, controller 110 may include other components. For example, controller 110 may include managers and schedulers for managing read, write, and erase operations within data storage system 100. In addition to decoder 310, controller 110 may include an encoder for encoded data prior to storage in non-volatile memory 130. The encoder and decoder are not limited to any particular error-correcting code (ECC) algorithm. For example, a low-density parity-check code may be used to encode and decode data within data storage system 100. Controller 110 may include multiple instances of encoder and decoders, some of which may be dedicated to soft decoding processes while others to hard decoding processes. Controller 110 also may include an address translation manager to manage the translation of host addresses used by host system 150 to physical addresses of the blocks, wordlines and pages within non-volatile memory 130. Other components may include scramblers, descramblers, maintenance managers (e.g., garbage collection, wear leveling, data relocation, etc.).

The components of controller 110 each may be implemented using one or more sequences of instructions (e.g., software/firmware) loaded and executed by a processor or processor core, using hardware logic circuits, or a combination of hardware and software/firmware. For example, in a controller that includes multiple processors or a multi-core processor, individual processors or processor cores may be assigned to provide the functionality of respective components of controller 110. Furthermore, one or more of the components discussed above may be implemented outside of controller 110 without departing from the scope of the subject technology.

Figure 4:
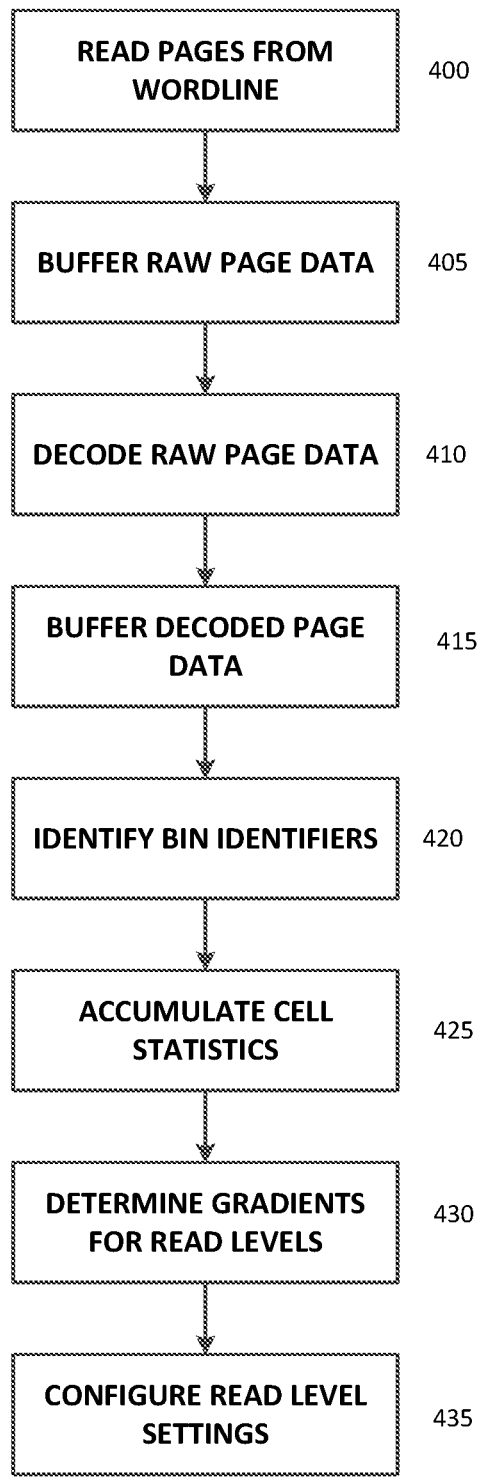
FIG. 4 is a flowchart illustrating a process of read level tracking and adjustment according to aspects of the subject technology.

FIG. 4 is a flowchart illustrating a process of read level tracking and adjustment according to aspects of the subject technology. The process may be initiated by controller 110 as part of a periodic maintenance process or in response to a trigger event. Trigger events may include an error rate exceeding a threshold, program/erase cycle counts reaching a milestone, data retention time reaching a threshold, etc. The process may be performed using data read from a wordline of block selected from each of the non-volatile memory devices 130, from respective die in the non-volatile memory devices 130, from a logical group of blocks within the non-volatile memory devices 130, etc. Blocks may have wordlines designated for this process or the controller may select a wordline from a given block randomly or according to a predetermined order.

Upon controller selecting a block and a wordline within the block, controller 110 may issue a read command to the non-volatile memory device 130 containing the selected block and the pages stored in the wordline are returned to controller 110 (block 400). As discussed above with respect to FIG. 1, TLC flash memory cells are configured to store three bits of data in each cell. In the wordline, the upper bit from each cell in the wordline make up an upper page of data, the middle bit from each cell in the wordline make up a middle page of data, and the lower bit from each cell in the wordline make up a lower page of data. This breakdown of the data in a wordline into an upper page, a middle page, and a lower page is illustrated in FIG. 5.

Figure 5:
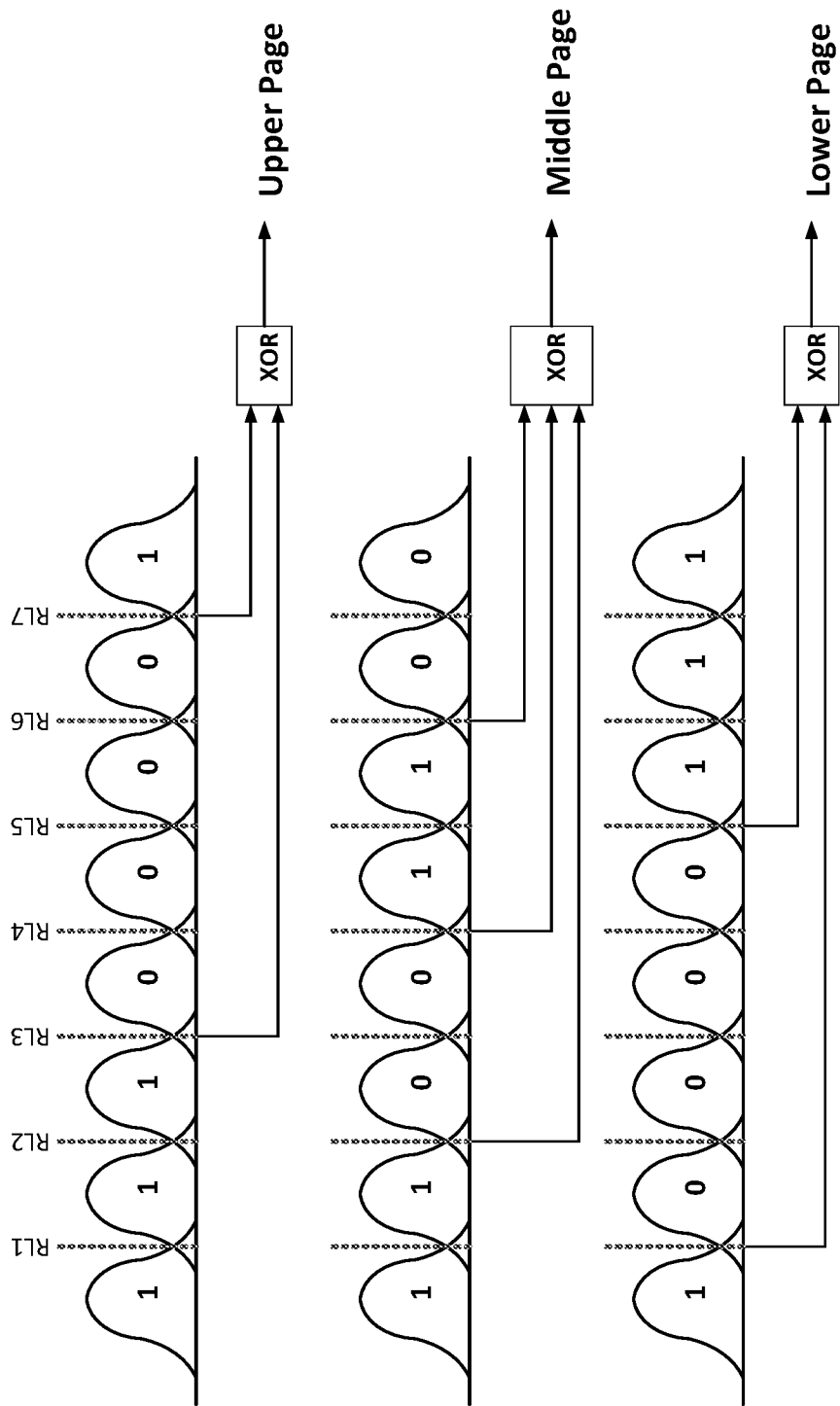
FIG. 5 is a diagram illustrating program level distributions of TLC flash memory cells divided into pages according to aspects of the subject technology.

FIG. 5 is a diagram illustrating program level distributions of TLC flash memory cells divided into pages according to aspects of the subject technology. Each of the program level distributions is shown with the logical data value corresponding to the respective program level distribution for each page. Also indicated in FIG. 5 are the read levels and logical operations to read out each of the pages from a wordline. For example, to read the upper page from a wordline, read levels RL3 and RL7 are applied to the memory cells in the wordline and the results are XOR'd in a logical operation to determine which memory cells in the wordline are programmed to a logical "1" data value and which memory cells in the wordline are programmed to a logical "0" data value in the upper page. Similarly, read levels RL2, RL4, and RL6 are used to read out the data values for the middle page of the wordline, and read levels RL1 and RL5 are used to read out the data values for the lower page of the wordline. The assignment of logical data values to the respective program level distributions is based on a configurable gray coding scheme. The subject technology is not limited to the gray coding scheme illustrated in FIG. 5 and may be implemented using other gray coding schemes.

Returning to FIG. 4, as raw page data for each page is read and received from the non-volatile memory device 130, controller 110 buffers the raw page data in a first set of buffers 305 (block 405). For example, the first set of buffers may include a buffer having capacity to hold a full page of raw page data for each of the upper page, the middle page, and the lower page.

In addition to buffering the raw page data of the pages read from the wordline, controller 110 provides the raw page data for each of the pages to decoder 310 for decoding (block 410). Decoder 310 may employ an ECC algorithm to decode the raw page data of each page. For example, decoder 310 may use an LDPC algorithm to decode the raw page data. Decoder 310 may operate as a hard decoder or a soft decoder. Upon completing the decoding process, decoder 310 provides decoded page data and a decoding success signal. The decoded page data for each of the pages is stored in a second set of buffers 315 similar to the first set of buffers 305 (block 415). The decoding success signal may include a bit for each of the upper page, the middle page, and the lower page to indicate whether the raw page data for the respective page was successfully decoded. The decoding success signal may be provided by setting bit values in a register that may be access by other components within controller 110 to perform other operations described below.

If one or more of the pages read from the wordline was not successfully decoded, the corresponding bit in the success signal would be set to indicate the failure and the raw page data read from the wordline for that page would be buffered in the corresponding buffer of the second set of buffers. In certain diagnostic modes, controller 110 may bypass the decoding process and load diagnostic data comprising known data values into the second set of buffers 315. For example, known data values may have been programmed into a designated wordline of a designated block. Rather than decoding the raw page data read from the designated wordline, controller 110 may select to load the know data values from diagnostic data 325 into the second set of buffers 315 and complete the process using the known data values together with the raw page data.

With the raw page data loaded into the first set of buffers and the decoded page data loaded into the second set of buffers, bin identifiers are identified for each of the memory cells of the wordline. According to aspects of the subject technology, a first set of bin identifiers is determined for the memory cells of the wordline using the raw page data buffered in the first set of buffers and a second set of bin identifiers is determined for the memory cells of the wordline using the decoded page data buffered in the second set of buffers (block 420). Using the data values from each of the upper page, the middle page, and the lower page for a given memory cell, a bin identifier may be identified using a reverse gray coding mapping or look-up table. Referring back to FIG. 1, for example, Table 1 may be used to identify the bin corresponding to each memory cell based on the data values read from the memory cell:

TABLE 1

| U-M-L Data Values | Bin Identifier |
|---|---|
| 000 | 3 |
| 001 | 6 |
| 010 | 4 |
| 011 | 5 |
| 100 | 2 |
| 101 | 7 |
| 110 | 1 |
| 111 | 0 |

The subject technology is not limited to the mappings represented in Table 1. Other gray coding schemes, which generate different mappings, may be used within the scope of the subject technology. Table 1 may be stored within controller 110 and may be replaced with other tables should data storage device 100 be configured to store data according to a different gray coding scheme.

Figure 6:
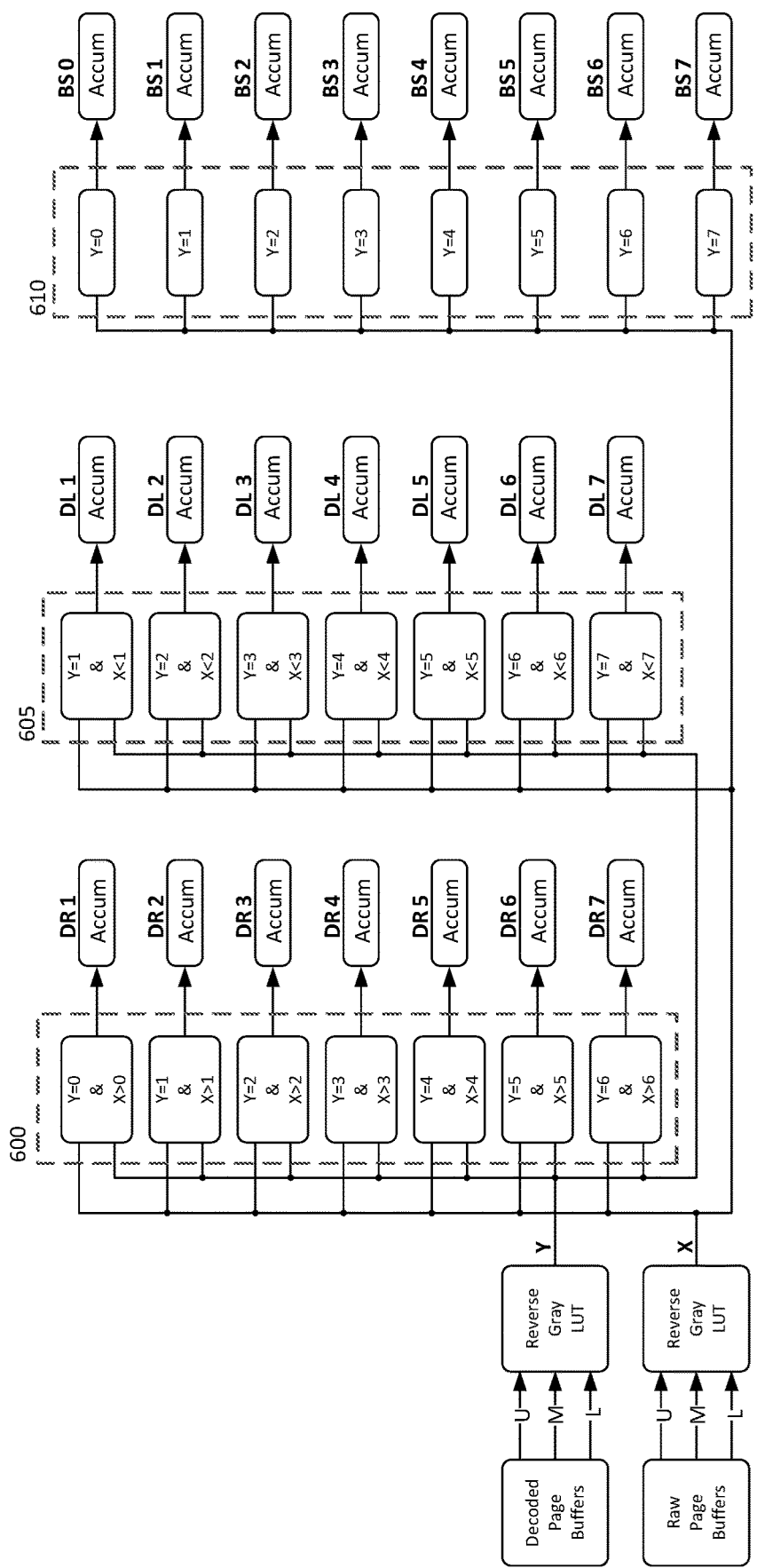
FIG. 6 is a diagram illustrating the accumulation of cell-level statistics according to aspects of the subject technology.

Using the first and second sets of bin identifiers, cell-level statistics are accumulated based on the sets of bin identifiers (block 425) in cell level statistics module 330. FIG. 6 is a diagram illustrating the accumulation of cell-level statistics according to aspects of the subject technology. As depicted in FIG. 6, data values from each of the upper page, the middle page, and the lower page are used to identify a bin identifier for the memory cell using a look-up table such as Table 1 shown above. The bin identifier determined based on the raw page data for a given memory cell is indicated as "X" in FIG. 6 and the bin identifier determined based on the decoded page data for the memory cell is indicated as "Y" in FIG. 6. For each of the memory cells in the wordline, these two bin identifier values are provide to logic 600, logic 605, and logic 610 to accumulate the cell-level statistics used in aspects of the processes described herein. Logic 600, logic 605, and logic 610 may be implemented using hardware logic circuits, software or firmware executed by a processor or group of processors, or a combination of the hardware logic circuits and software/firmware.

Logic 600 represents a determination of read errors resulting from a read level voltage being set below an optimal voltage. Under this condition, a memory cell may be identified as being in a first bin based on the raw page data, but corrected to a lower bin based on the decoded page data. For example, a memory cell may be identified as being programed in bin 1 (i.e., X>0) corresponding to data values of 110 in FIG. 1 based on raw page data read from the wordline. After decoding the raw page data, the memory cell may be identified as being in bin 0 (i.e., Y=0) corresponding to data values 111 in FIG. 1. If these conditions are met (X>0 and Y=0), an accumulator DR1 is incremented. Similarly, accumulator DR2 is incremented if X>1 and Y=1 are met, accumulator DR3 is incremented if X>2 and Y=2 are met, accumulator DR4 is incremented if X>3 and Y=3 are met, accumulator DR5 is incremented if X>4 and Y=4 are met, accumulator DR6 is incremented if X>5 and Y=5 are met, and accumulator DR7 is incremented if X>6 and Y=6 are met.

Logic 605 represents a determination of read errors resulting from a read level voltage being set above an optimal voltage. Under this condition, a memory cell may be identified as being in a first bin based on the raw page data, but corrected to a higher bin based on the decoded page data. For example, a memory cell may be identified as being programed in bin 0 (i.e., X<1) corresponding to data values of 111 in FIG. 1 based on raw page data read from the wordline. After decoding the raw page data, the memory cell may be identified as being in bin 1 (i.e., Y=1) corresponding to data values of 110 in FIG. 1. If these conditions are met (X<1 and Y=1), an accumulator DL1 is incremented. Similarly, accumulator DL2 is incremented if X<2 and Y=2 are met, accumulator DL3 is incremented if X<3 and Y=3 are met, accumulator DL4 is incremented if X<4 and Y=4 are met, accumulator DL5 is incremented if X<5 and Y=5 are met, accumulator DL6 is incremented if X<6 and Y=6 are met, and accumulator DL7 is incremented if X<7 and Y=7 are met.

Logic 610 represents tracking of the number of instances or counts of memory cells identified to be in each of the eight bins. As a memory cell is identified as being in a particular bin, an accumulator corresponding to the bin is incremented. As indicated in FIG. 6, accumulator BS0 is for bin 0 (Y=0), accumulator BS1 is for bin 1 (Y=1), accumulator BS2 is for bin 2 (Y=2), accumulator BS3 is for bin 3 (Y=3), accumulator BS4 is for bin 4 (Y=4), accumulator BS5 is for bin 5 (Y=5), accumulator BS6 is for bin 6 (Y=6), and accumulator BS7 is for bin 7 (Y=7).

Each of the accumulators may be implemented using a multi-bit register (e.g., 32 bits). The accumulators may be reset after processing of a single wordline has been completed or may be maintained for the processing of multiple wordlines. For example, the cell-level statistics may be accumulated for one or more wordlines of a particular block or multiple wordlines from multiple different blocks for purposes of adjusting the read levels according to aspects of the subject technology.

Once cell-level statistics have been accumulated for a wordline, or group of wordlines, cell level statistics module 330 provides the accumulator values, or access to the respective accumulators, to bin balance module 335 and decision directed module 340 to determine gradients for the read levels (block 430).

Bin balance module 335 implements a bin balance gradient algorithm. According to aspects of the subject technology, the bin balance gradient algorithm determines gradients for the respective read levels based on the bin counts BS0-BS7 accumulated for the wordline or group of wordlines. The bin balance gradient algorithm does not rely on decoded data and therefore provides for gradient determination when the raw page data has relatively high error rates and may be undecodable. However, the bin balance gradient algorithm relies on an assumption that under optimal read level settings, the bin counts across all of the bins will be equal and therefore is sensitive to data patterns and is effective when a random data pattern is used when writing data to the non-volatile memory devices 130.

The bin balance gradient algorithm uses a gradient generator matrix to decouple the gradients and improve the quality of the algorithm. The gradient generator matrix is based on a basic model of correlation between bin counts and read level gradients. According to aspects the subject technology, the basic model may be represented by the following:

$$\begin{bmatrix} 1 & 0 & 0 & 0 & 0 & 0 & 0 \\ -1 & 1 & 0 & 0 & 0 & 0 & 0 \\ 0 & -1 & 1 & 0 & 0 & 0 & 0 \\ 0 & 0 & -1 & 1 & 0 & 0 & 0 \\ 0 & 0 & 0 & -1 & 1 & 0 & 0 \\ 0 & 0 & 0 & 0 & -1 & 1 & 0 \\ 0 & 0 & 0 & 0 & 0 & -1 & 1 \\ 0 & 0 & 0 & 0 & 0 & 0 & -1 \end{bmatrix} \times \begin{bmatrix} BG1 \\ BG2 \\ BG3 \\ BG4 \\ BG5 \\ BG6 \\ BG7 \end{bmatrix} = \begin{bmatrix} BS0 \\ BS1 \\ BS2 \\ BS3 \\ BS4 \\ BS5 \\ BS6 \\ BS7 \end{bmatrix} \quad (1)$$

Equation (1) illustrates a matrix C having elements that describe how bin counts (BS0-BS7) change with read level offsets or gradients (BG1-BG7) for the read levels. Taking the pseudo inverse of the matrix C provides the gradient generator matrix. The pseudo matrix is determined using the following:

$$C^+ = (C^T C)^{-1} C^T \quad (2)$$

Using the pseudo inverse of the matrix C from equation (1) above as the gradient generator matrix, the following equation converts bin counts (BS0-BS7) to decoupled gradients (BG1-BG7) for the read levels:

$$\begin{bmatrix} 21 & -3 & -3 & -3 & -3 & -3 & -3 & -3 \\ 18 & 18 & -6 & -6 & -6 & -6 & -6 & -6 \\ 15 & 15 & 15 & -9 & -9 & -9 & -9 & -9 \\ 12 & 12 & 12 & 12 & -12 & -12 & -12 & -12 \\ 9 & 9 & 9 & 9 & 9 & -15 & -15 & -15 \\ 6 & 6 & 6 & 6 & 6 & 6 & -18 & -18 \\ 3 & 3 & 3 & 3 & 3 & 3 & 3 & -21 \end{bmatrix} \times \begin{bmatrix} BS0 \\ BS1 \\ BS2 \\ BS3 \\ BS4 \\ BS5 \\ BS6 \\ BS7 \end{bmatrix} = \begin{bmatrix} BG1 \\ BG2 \\ BG3 \\ BG4 \\ BG5 \\ BG6 \\ BG7 \end{bmatrix} \quad (3)$$

The gradient generator matrix in equation (3) is used when none of the pages read from the wordline are decodable. For example, the decoding success signal for the upper page, the middle page, and the lower page is set to indicate none of the three pages are decodable by decoder 310 (e.g., set to a logical 0). When one or more of the pages are decodable, the subject technology uses a gradient generator matrix that generates a zero gradient for the read levels used to read the page that was decoded by the decoder 310. For example, if the upper page read from the wordline was decodable indicated by a decoding success signal of (1,0,0), the third and seventh columns, corresponding to read levels RL3 and RL7 used to read the upper page of the wordline as shown in FIG. 5, are removed from the C matrix before calculating the pseudo inverse to use as the generator matrix. With these columns removed, the gradient generator matrix used to convert bin counts to decoupled gradients becomes:

$$\begin{bmatrix} 16 & -8 & -8 & 0 & 0 & 0 & 0 & 0 \\ 8 & 8 & -16 & 0 & 0 & 0 & 0 & 0 \\ 0 & 0 & 0 & 0 & 0 & 0 & 0 & 0 \\ 0 & 0 & 0 & 18 & -6 & -6 & -6 & 0 \\ 0 & 0 & 0 & 12 & 12 & -12 & -12 & 0 \\ 0 & 0 & 0 & 6 & 6 & 6 & -18 & 0 \\ 0 & 0 & 0 & 0 & 0 & 0 & 0 & 0 \end{bmatrix} \times \begin{bmatrix} BS0 \\ BS1 \\ BS2 \\ BS3 \\ BS4 \\ BS5 \\ BS6 \\ BS7 \end{bmatrix} = \begin{bmatrix} BG1 \\ BG2 \\ BG3 \\ BG4 \\ BG5 \\ BG6 \\ BG7 \end{bmatrix} \quad (4)$$

The process to determine the gradient generator matrix in equation (4) may be repeated for each combination of decodable/undecodable pages (e.g., decoding success signals of (0,1,0), (0,0,1), (0,1,1), (1,0,1), and (1,1,0)) by removing columns from the initial C matrix corresponding to the read levels used to read the pages that were successfully decoded and calculating the pseudo inverse to use as the gradient generator matrix. According to this process, all elements of the gradient generator matrix when all three pages are decodable (e.g., decoding success signal of (1,1,1)) are zero.

According to aspects of the subject technology, a scale factor is applied to the pseudo inverse of the matrix to make all of the elements in the gradient generator matrix integers. For example, the gradient generator matrix in equation (4) was created by scaling the elements of the pseudo inverse matrix by 24. Using integer elements simplifies the logic required to implement the bin balance module 335 to generate the gradients. The scale factor of 24 was selected as the smallest scale factor that would bring all of the elements of all of the pseudo inverse matrices from the different combinations of decodable pages to integer values.

Figure 7:
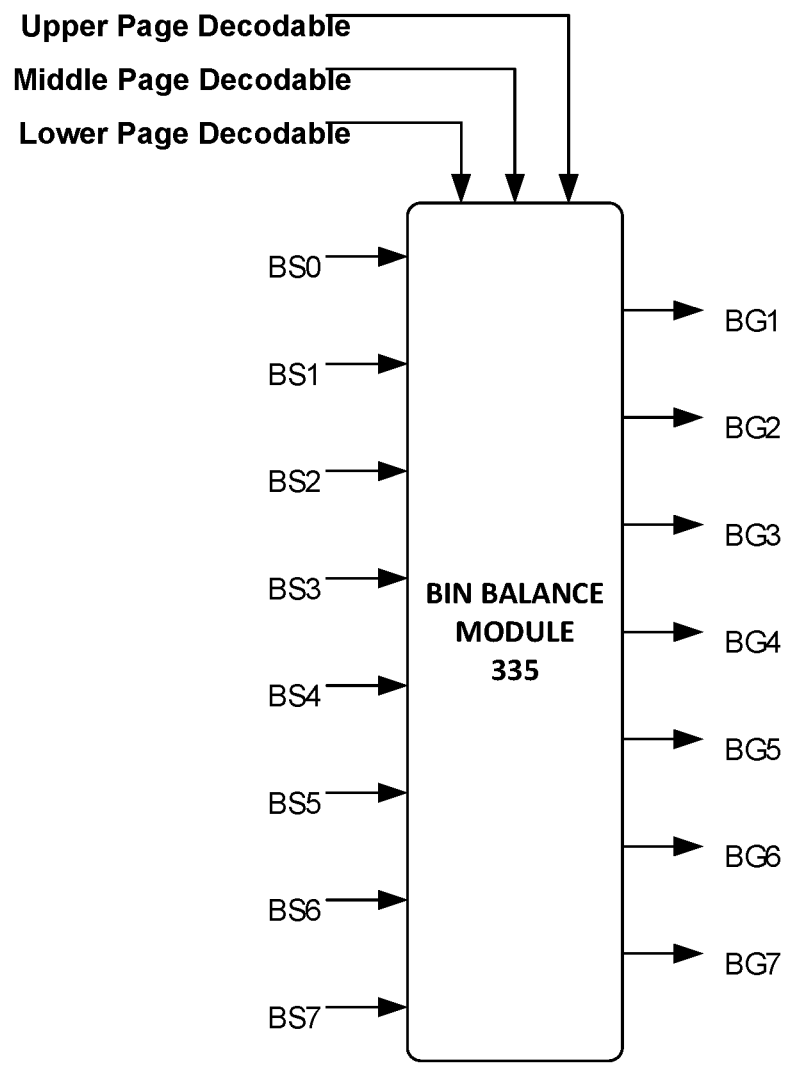
FIG. 7 is a block diagram illustrating the inputs and outputs within the bin balance module according to aspects of the subject technology.

FIG. 7 is a block diagram illustrating the inputs and outputs within the bin balance module 335 according to aspects of the subject technology. The bin balance module 335 stores the gradient generator matrices for all the different combinations of decodable/undecodable pages read from wordline. The bin balance module 335 receives the bin counts (BS0-BS7) from the cell level statistics module 330, selects the appropriate gradient generator matrix using the decoding success signals generated by decoder 310 indicating whether the upper page, the middle page, and the lower page were decodable, and generates read level gradients BG1-BG7.

After the read level gradients BG1-BG7 are determined, the read level gradients may be mapped to final gradients used to configure the settings for the read levels in the non-volatile memory devices 130. According to aspects of the subject technology, the bin balance mapping determines a value and sign by which the read level setting in the non-volatile memory device 130 is adjusted based on the following:

$$S = fix\left(\frac{BG * BB \text{ Gain Select}}{2^{16}}\right) \quad (5)$$

BG represents the read level gradient generated using the gradient generator matrix discussed above for the particular read level for which the mapping is being done. For example, this mapping is done for each of RL1 to RL7 using BG1 to BG7, respectively. The BB Gain Select value is a programmable value that may be programmed in the bin balance module 335 at a value selected from an available range of values using simulation or laboratory testing to identify a value that minimize error rates. For example, the range may be set at a value of 1 to a value of 64. The BB Gain Select value programmed may vary depending on the granularity of levels available to adjust the read levels. For example, in a non-volatile memory device operating as TLC flash memory, there may be 512 levels across the range of threshold voltages that may be set for the read levels and the BB Gain Select value may be set at 32. For a non-volatile memory device operating as QLC flash memory, there may be 1024 levels across the range of threshold voltages that may be set for the read levels and the BB Gain select value may be set at 5.

The divisor shown in equation (5) works with the BB Gain Select value to account for the scale factor used to bring the elements of the gradient generator matrix to be integer values. The "fix" function rounds the results of the equation to the nearest integer toward zero. To avoid large jumps in read levels during each iteration of the process, saturation values may be specified such that if the mapped gradient magnitude exceeds either a positive saturation value or a negative saturation value, the final gradient is set at either the positive saturation value or the negative saturation value (e.g., +8 or −8).

Decision directed module 340 implements a decision directed algorithm. According to aspects of the subject technology, the decision directed algorithm determines gradients for the respective read levels based on the read error counts due to the read levels being set above or below an optimal read level (e.g., DR1-DR7 and DL1-DL7). For example, the decision directed algorithm may seek to balance these read error counts for each read level. Unlike the bin balance algorithm, the decision directed algorithm is insensitive to bit patterns but requires the raw page data to be decodable by decoder 310. Furthermore, the decision directed algorithm may be adjusted to account for dissimilar bin distributions that may be common in certain types of flash memory such as 3D-NAND flash memory.

Using the read error counts DR1-DR7 and DL1-DL7, mapping is performed to determine a final gradient by which to adjust the respective read levels. According to aspects of the subject technology, gradients for each of the read levels may be mapped from the respective accumulated read error counts using the following:

$$T = \mathit{fix}\left(\frac{((DL - DR) * DD \text{ Gain Select})}{32}\right) \quad (6)$$

The DD Gain Select value is a programmable value that may be programmed in the decision directed module 340 at a value selected from an available range of values using simulation or laboratory testing to identify a value that minimize error rates. For example, the range may be set at a value of 1 to a value of 15. The DD Gain Select value programmed may vary depending on the granularity of levels available to adjust the read levels. For example, in a non-volatile memory device operating as TLC flash memory, there may be 512 levels across the range of threshold voltages that may be set for the read levels and the DD Gain Select value may be set at 4. For a non-volatile memory device operating as QLC flash memory, there may be 1024 levels across the range of threshold voltages that may be set for the read levels and the DD Gain select value may be set at 8.

The divisor shown in equation (6) represents one example and may be set based on simulation or testing results. As with equation (5) above, the "fix" function rounds the results of the equation to the nearest integer toward zero. To avoid large jumps in read levels during each iteration of the process, saturation values may be specified such that if the mapped value exceeds either a positive saturation value or a negative saturation value, the adjustment value is set at either the positive saturation value or the negative saturation value (e.g., +8 or −8).

As noted above, the decision directed algorithm may be configured to balance the read error counts for each read level. Balancing the read error counts may be thought of as balancing the area under the tails of adjacent distributions that cross the read level between the two distributions. However, when adjacent distributions are dissimilar balancing these read errors may not produce the lowest overall bit error rate for the data storage system. The bit error rate for the data storage system may be lower when the read level is close to the intersection of the two adjacent distributions rather than the location that equalizes the areas under the respective tails. Dissimilar distributions often occur in the first program level distribution, which is the erased state of the memory cells, compared to the second program level distribution. Other pairs of adjacent program level distributions also may have dissimilar distributions.

To account for the dissimilar distributions and to determine a gradient that brings the respective read level close to an optimal read level producing the lowest bit rate, the decision directed module 340 may be programmed with a bias feature to account for the dissimilar distribution. According to aspects of the subject technology, a manual bias may be programmed in the decision direct module 340. Under the manual bias configuration, equation (6) is modified to:

$$T = \mathit{fix}\left(\frac{((DL - (Atten * DR)) * DD \text{ Gain Select})}{32}\right) \quad (7)$$

As indicated in equation (7), the error count for DR for the respective read level is multiplied by an attenuation value, Atten. The value of Atten may be selected based on simulation or test results and may be selected from values such as 1, 0.5, 0.375, 0.25, etc.

Alternatively, the decision directed module 340 may be programmed with an auto-bias feature that adjusts the gradient for a respective read level based on an erase state sigma estimator ESE. Under the auto-bias configuration, equation (6) is modified to:

$$T = \mathit{fix}\left(\frac{(((DL - DR) + (0.5 * ESE)) * DD \text{ Gain Select})}{32}\right) \quad (8)$$

ESE may be determined using the following:

$$ESE = (DL_1 + DL_1) - \frac{1}{6}\sum_{x=2}^{7}(DL_x + DL_x) \quad (9)$$

While equation (9) shows the calculation for an ESE value for the first read level, RL1, the equation may be adapted for any of the read levels within the scope of the subject technology.

Returning to FIG. 4, controller 110 selects final read level gradients determined by the bin balance module 335 and the decision directed module 340 and configures the respective read levels in the non-volatile memory devices 130 (block 435). Read level settings may be maintained in registers in the non-volatile memory devices 130. Controller 110 may configure the settings for the read levels by programming new values into the registers that have been adjusted based on the final read level gradients. The process represented in FIG. 4 may be performed to adjust read levels for a group of blocks represented by the block containing the wordline from which the pages were read, a die or group of die, a non-volatile memory device or group of non-volatile memory devices, etc.

Figure 8:
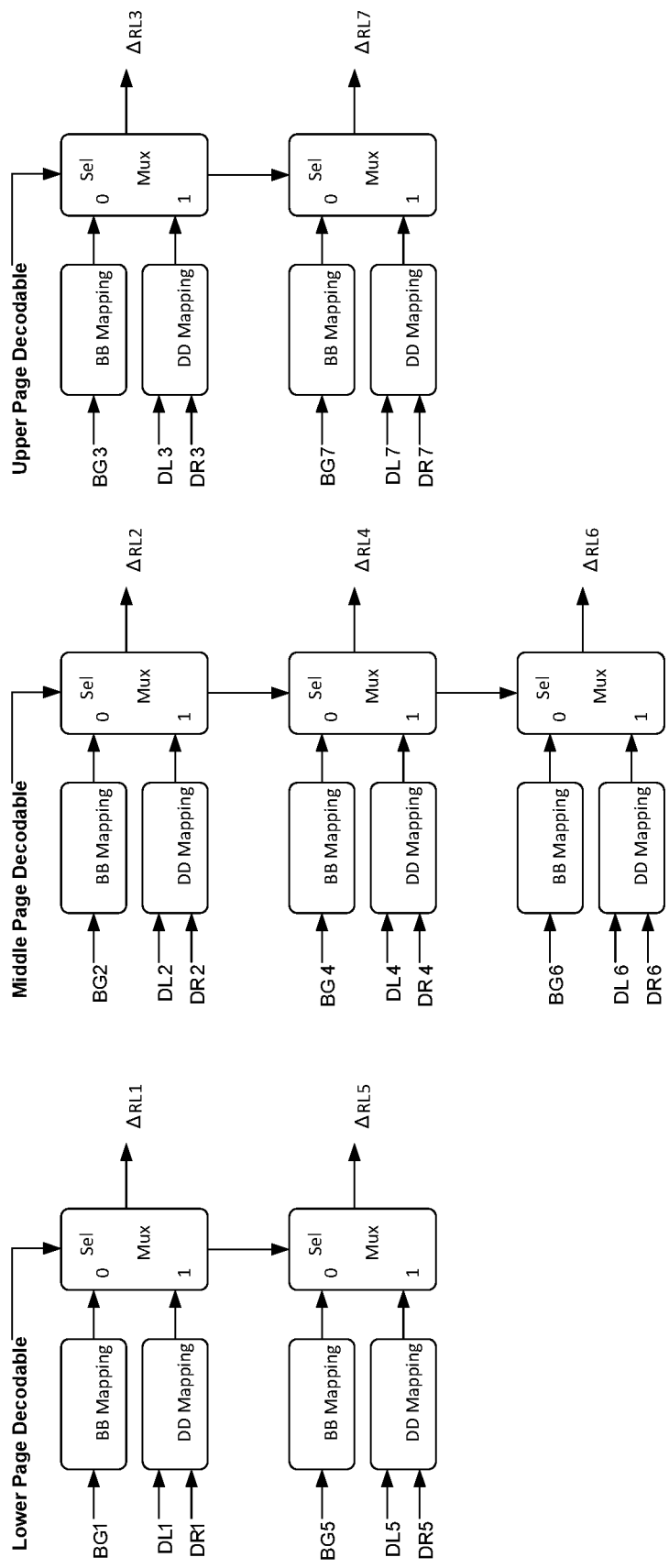
FIG. 8 is a block diagram breaking out selection logic for selecting read level gradients for the respective read levels according to aspects of the subject technology.

The final read level gradients may be selected from the gradients determined by the bin balance module 335 and the decision directed module 340 using selection logic 345 according to aspects of the subject technology. The selection between the bin balance module 335 and the decision directed module 340 is made using the selection logic 345 based on the decoding success signal indicating which pages read from the wordline were decodable. FIG. 8 is a block diagram breaking out the selection logic for selecting the read level gradients for the respective read levels according to aspects of the subject technology.

As depicted in FIG. 8, the read level gradients ($\Delta RL1/BG1$, $\Delta RL2/BG2$, $\Delta RL3/BG3$, $\Delta RL4/BG4$, $\Delta RL5/BG5$, $\Delta RL6/BG6$, and $\Delta RL7/BG7$) are selected from the bin balance module output and the decision directed module output with multiplexor logic driven by the decoding success signals corresponding to the respective pages. The particular decoding success signals are selected based on the read levels used to read the particular pages. As indicated in FIG. 5, the lower page is read from the wordline using read level RL1 and read level RL5. Accordingly, if the lower page was decodable, read levels RL1 and RL5 are adjusted using gradients determined by the directed decision module. If the lower page was not decodable, read levels RL1 and RL5 are adjusted using gradients determined by the bin balance module. Similarly, read levels RL2, RL4, and RL6 are adjusted using gradients determined by the directed decision module if the middle page was decodable and gradients determined by the bin balance module if the middle page was not decodable. Finally, read levels for RL3 and RL7 are adjusted using gradients determined by the directed decision module if the upper page was decodable and by the bin balance module if the upper page was not decodable.

The blocks of the flowchart illustrated in FIG. 4 have been described as occurring sequentially. The subject technology is not limited to the described sequential performance of the illustrated process. One or more of the blocks may be performed in parallel with other blocks in the illustrated process. Other variations in the illustrated process are within the scope of the subject technology.

The foregoing description has been provided with respect to flash memory operating in a TLC configuration. The subject technology is not limited to TLC flash memory and may be practiced to track and adjust other types of non-volatile memory such as QLC flash memory by adapting the processes described above to QLC flash memory as well as other types of non-volatile memory. The adaptation will not be described herein.

According to aspects of the subject technology, a method for tracking and adjusting read levels is provided. The method may comprise reading a pages from a wordline of a flash memory device and buffering raw page data read from the wordline for each of the plurality of pages in a first set of buffers. The method may further include providing the raw page data for each of the plurality of pages to a decoder for decoding and buffering decoded page data from the decoder for each of the plurality of pages in a second set of buffers. A first plurality of bin identifiers for memory cells of the wordline may be identified based on the raw page data buffered in the first set of buffers and a second plurality of bin identifiers for the memory cells of the wordline may be identified based on the decoded page data buffered in the second set of buffers. Cell-level statistics may be accumulated based on the first plurality of bin identifiers and the second plurality of bin identifiers and a gradient for each of a plurality of read levels determined based on decoding results for each of the plurality of pages and the cell-level statistics. Settings for the plurality of read levels in the flash memory device may be configured based on the determined gradients.

The method may further include identifying the first plurality of bin identifiers for the memory cells of the wordline based on logical values in the raw page data for the plurality of pages corresponding to the respective memory cells, and the second plurality of bin identifiers for the memory cells of the wordline may be identified based on logical values in the decoded page data for the plurality of pages corresponding to the respective memory cells. Identifying the first plurality of bin identifiers may include applying reverse gray coding to the logical values in the raw page data, and identifying the second plurality of bin identifiers may include applying the reverse gray coding to the logical values in the decoded page data.

Accumulating the cell-level statistics may include incrementing bin counts based on the identified first plurality of bin identifiers or the identified second plurality of bin identifiers. Accumulating the cell-level statistics also may include comparing the first plurality of bin identifiers to the second plurality of bin identifiers, respectively and incrementing first error-type counts and second error-type counts based on the comparison of the first plurality of bin identifiers to the second plurality of bin identifiers.

Determining a gradient for each of the plurality of read levels may include applying a gradient generator matrix to the bin counts to determine a first set of gradients and determining a second set of gradients based on a difference between the first error-type counts and the second error-type counts. For each of the plurality of read levels, a gradient may be selected from the first set of gradients or a gradient from the second set of gradients based on the decoding results for each of the plurality of pages. The gradient generator matrix may be applied to the bin counts by selecting the gradient generator matrix from a plurality of gradient generator matrices based on the decoding results for each of the plurality of pages and multiplying the selected gradient generator matrix by the bin counts to determine the first set of gradients. Each of the determined gradients may include a magnitude and a direction for adjusting a respective read level of the plurality of read levels in the flash memory device.

According to aspects of the subject technology, a processor-readable storage medium encoded with instructions that, when executed by a processor, cause the processor to perform a method may be provided. The method may include comprising reading a plurality of pages from a wordline of a flash memory device and buffering raw page data read from the wordline for each of the plurality of pages in a first set of buffers. The method may further include providing the raw page data for each of the plurality of pages to a decoder for decoding and buffering decoded page data from the decoder for each of the plurality of pages in a second set of buffers. A first plurality of bin identifiers for memory cells of the wordline may be identified based on logical values corresponding to the respective memory cells in the raw page data buffered in the first set of buffers, and a second plurality of bin identifiers for the memory cells of the wordline may be identified based on logical values corresponding to the respective memory cells in the decoded page data buffered in the second set of buffers. Cell-level statistics may be accumulated based on the first plurality of bin identifiers and the second plurality of bin identifiers and a gradient for each of a plurality of read levels may be determined based on decoding results for each of the plurality of pages and the cell-level statistics. Settings for the plurality of read levels in the flash memory device may be configured based on the determined gradients.

The first plurality of bin identifiers may be identified by applying reverse gray coding to the logical values in the raw page data, and the second plurality of bin identifiers may be identified by applying the reverse gray coding to the logical values in the decoded page data. Cell-level statistics may be accumulated by incrementing bin counts based on the identified first plurality of bin identifiers or the identified second plurality of bin identifiers, comparing the first plurality of bin identifiers to the second plurality of bin identifiers, respectively, and incrementing first error-type counts and second error-type counts based on the comparison of the first plurality of bin identifiers to the second plurality of bin identifiers.

A gradient for each of the plurality of read levels may be determined by applying a gradient generator matrix to the bin counts to determine a first set of gradients, determining a second set of gradients based on a difference between the first error-type counts and the second error-type counts, and selecting, for each of the plurality of read levels, a gradient from the first set of gradients or a gradient from the second set of gradients based on the decoding results for each of the plurality of pages. Applying the gradient generator matrix to the bin counts may include selecting the gradient generator matrix from a plurality of gradient generator matrices based on the decoding results for each of the plurality of pages, and multiplying the selected gradient generator matrix by the bin counts to determine the first set of gradients. Each of the determined gradients may include a magnitude and a direction for adjusting a respective read level of the plurality of read levels in the flash memory device.

According to aspects of the subject technology, a data storage system is provided that includes a flash memory device comprising a plurality of wordlines, a first set of buffers, a second set of buffers, and a controller. The controller may be configured to read a plurality of pages from a wordline of the plurality of wordlines in the flash memory device and buffer raw page data read from the wordline for each of the plurality of pages in the first set of buffers. The controller may be further configured to provide the raw page data for each of the plurality of pages to a decoder for decoding and buffer decoded page data from the decoder for each of the plurality of pages in the second set of buffers. The controller may identify a first plurality of bin identifiers for memory cells of the wordline based on the raw page data buffered in the first set of buffers, and identify a second plurality of bin identifiers for the memory cells of the wordline based on the decoded page data buffered in the second set of buffers. The controller may accumulate cell-level statistics based on the first plurality of bin identifiers and the second plurality of bin identifiers and determine a gradient comprising a magnitude and a direction for each of a plurality of read levels based on decoding results for each of the plurality of pages and the cell-level statistics. The controller may configure settings for the plurality of read levels in the flash memory device based on the determined gradients.

The controller may identify the first plurality of bin identifiers for the memory cells of the wordline based on logical values in the raw page data for the plurality of pages corresponding to the respective memory cells, and the second plurality of bin identifiers for the memory cells of the wordline based on logical values in the decoded page data for the plurality of pages corresponding to the respective memory cells. The controller may be further configured to identify the first plurality of bin identifiers by applying reverse gray coding to the logical values in the raw page data, and identify the second plurality of bin identifiers by applying the reverse gray coding to the logical values in the decoded page data.

The controller may be further configured to accumulate the cell-level statistics by incrementing bin counts based on the identified first plurality of bin identifiers or the identified second plurality of bin identifiers, comparing the first plurality of bin identifiers to the second plurality of bin identifiers, respectively, and incrementing first error-type counts and second error-type counts based on the comparison of the first plurality of bin identifiers to the second plurality of bin identifiers. The controller may be further configured to determine the gradient for each of the plurality of read levels by applying a gradient generator matrix to the bin counts to determine a first set of gradients, determining a second set of gradients based on a difference between the first error-type counts and the second error-type counts, and selecting, for each of the plurality of read levels, a gradient from the first set of gradients or a gradient from the second set of gradients based on the decoding results for each of the plurality of pages. The controller may be further configured to apply the gradient generator matrix to the bin counts by selecting the gradient generator matrix from a plurality of gradient generator matrices based on the decoding results for each of the plurality of pages, and multiplying the selected gradient generator matrix by the bin counts to determine the first set of gradients.

According to aspects of the subject technology, a data storage system is provided that includes a flash memory device comprising a plurality of wordlines, a first set of buffers, and a second set of buffers. The data storage system may further include means for identifying a first plurality of bin identifiers for memory cells of a wordline of the plurality of wordlines based on raw page data read from the wordline for each of a plurality of pages buffered in the first set of buffers, and means for identifying a second plurality of bin identifiers for the memory cells of the wordline based on page data decoded from the raw page data and buffered in the second set of buffers. The data storage system may further include means for accumulating cell-level statistics based on the first plurality of bin identifiers and the second plurality of bin identifiers, means for determining a gradient for each of a plurality of read levels based on decoding results for each of the plurality of pages and the cell-level statistics, and means for configuring settings for the plurality of read levels in the flash memory device based on the determined gradients.

The first plurality of bin identifiers for the memory cells of the wordline may be identified based on logical values in the raw page data for the plurality of pages corresponding to the respective memory cells, and the second plurality of bin identifiers for the memory cells of the wordline may be identified based on logical values in the decoded page data for the plurality of pages corresponding to the respective memory cells. The means for identifying the first plurality of bin identifiers may include means for applying reverse gray coding to the logical values in the raw page data, and the means for identifying the second plurality of bin identifiers may include means for applying the reverse gray coding to the logical values in the decoded page data.

The means for accumulating the cell-level statistics may include means for incrementing bin counts based on the identified first plurality of bin identifiers or the identified second plurality of bin identifiers, means for comparing the first plurality of bin identifiers to the second plurality of bin identifiers, respectively, and means for means for incrementing first error-type counts and second error-type counts based on the comparison of the first plurality of bin identifiers to the second plurality of bin identifiers. The means for determining a gradient for each of the plurality of read levels may include means for selecting a gradient generator matrix from a plurality of gradient generator matrices based on the decoding results for each of the plurality of pages, means for multiplying the selected gradient generator matrix by the bin counts to determine a first set of gradients, means for determining a second set of gradients based on a difference between the first error-type counts and the second error-type counts, and means for selecting, for each of the plurality of read levels, a gradient from the first set of gradients or a gradient from the second set of gradients based on the decoding results for each of the plurality of pages.

Many of the above-described features of example process and related features and applications, may be implemented as software or firmware processes that are specified as a set of instructions recorded on a processor-readable storage medium (also referred to as computer-readable medium). When these instructions are executed by one or more processing unit(s) (e.g., one or more processors, cores of processors, or other processing units), the processing unit(s) are caused to perform the actions indicated in the instructions. Examples of processor-readable media include, but are not limited to, volatile memory 120, non-volatile memory 130, as well as other forms of media such as magnetic media, optical media, and electronic media. The processor-readable media does not include carrier waves and electronic signals communicated wirelessly or over wired connections.

The term "software" is meant to include, where appropriate, firmware residing in memory or applications stored in memory, which may be read into a working memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code).

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject disclosure, and the subject disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the subject disclosure or that such aspect applies to all configurations of the subject disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject disclosure or that such implementation applies to all configurations of the subject disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the subject disclosure or that such configuration applies to all configurations of the subject disclosure. A disclosure relating to a configuration may apply to all configurations, or one or more configurations. A configuration may provide one or more examples. A phrase such as a "configuration" may refer to one or more configurations and vice versa.

The word "exemplary" is used to mean "serving as an example or illustration." Any aspect or design described herein as "exemplary" is not necessarily to be construed as preferred or advantageous over other aspects or designs.

What is claimed is:

1. A method for a data storage device, the method comprising:
    reading data from memory cells of memory;
    buffering the read data;
    decoding the read data to generate decoded data;
    determining whether the read data is decodable;
    determining cell level statistics based on the buffered data and the decoded data;
    determining gradients for read-level voltages associated with the memory based on results of the decoding and the cell level statistics, wherein when a first portion of the data read using one or more first read-level voltages is not decodable, a first gradient determination technique is selected for the one or more first read-level voltages, and when a second portion of the data read using one or more second read-level voltages is decodable, a second gradient determination technique, different from the first gradient determination technique, is selected for the one or more second read-level voltages; and
    configuring settings for the read-level voltages associated with the memory based on the gradients.

2. The method of claim 1, wherein the first gradient determination technique is a bin balance process, and the second gradient determination technique is a decision directed process.

3. The method of claim 2, wherein determining the gradients comprises:
    providing the cell level statistics to a bin balance module to run the bin balance process and to a decision directed module to run the decision directed process; and
    processing the cell level statistics with the bin balance process and the decision directed process.

4. The method of claim 2, wherein configuring the settings for the read-level voltages comprises:
    adjusting a parameter of a respective read-level voltage of the read-level voltages using a gradient determined by the bin balance process when the first portion of the read data is not decodable; and
    adjusting a parameter of a respective read-level voltage of the read-level voltages using a gradient determined by the directed decision process when the second portion of the read data is decodable.

5. The method of claim 2, wherein the decision directed process determines gradients based on read error counts.

6. The method of claim 5, comprising:
    determining that one or more of the read error counts requires balancing for each of the read-level voltages; and
    balancing an area under tails of adjacent read-level distributions that cross a read-level voltage between the adjacent read-level distributions.

7. The method of claim 6, the decision directed process comprises:
    adjusting a gradient for a respective read-level voltage of the read-level voltages based on a bias; and
    reducing an amount of dissimilarity between the adjacent read-level distributions based on the adjusted gradient.

8. A data storage system, comprising:
    memory; and
    one or more controllers configured to cause:
        reading data from memory cells of the memory;
        buffering the read data;
        decoding the read data to generate decoded data;
        determining whether the read data is decodable;
        determining cell level statistics based on the buffered data and the decoded data;
        determining gradients for read-level voltages associated with the memory based on results of the decoding and the cell level statistics, wherein when a first portion of the data read using one or more first read-level voltages is not decodable, a first gradient determination technique is selected for the one or more first read-level voltages, and when a second portion of the data read using one or more second read-level voltages is decodable, a second gradient determination technique, different from the first gradient determination technique, is selected for the one or more second read-level voltages; and
        configuring settings for the read-level voltages associated with the memory based on the gradients.

9. The data storage system of claim 8, wherein the first gradient determination technique is a bin balance process, and the second gradient determination technique is a decision directed process.

10. The data storage system of claim 9, wherein the decision directed process determines gradients based on read error counts.

11. The data storage system of claim 10, comprising:
    determining that one or more of the read error counts requires balancing for each of the read-level voltages; and
    balancing an area under tails of adjacent read-level distributions that cross a read-level voltage between the adjacent read-level distributions.

12. The data storage system of claim 11, the decision directed process comprises:
    adjusting a gradient for a respective read-level voltage of the read-level voltages based on a bias; and reducing an amount of dissimilarity between the adjacent read-level distributions based on the adjusted gradient.

13. The data storage system of claim 8, wherein each of the gradients comprises a magnitude and a direction for adjusting a respective read-level voltage of the read-level voltages associated with the memory.

14. The data storage system of claim 8, wherein determining the cell level statistics comprises:
   incrementing bin counts based on a first set of bin identifiers or a second set of bin identifiers, wherein the first set of bin identifiers is associated with the buffered data, and the second set of bin identifiers is associated with the decoded data;
   comparing the first set of bin identifiers to the second set of bin identifiers; and
   incrementing first error-type counts and second error-type counts based on the comparison of the first set of bin identifiers to the second set of bin identifiers.

15. The data storage system of claim 14, wherein determining the gradients for the read-level voltages comprises:
   applying a gradient generator matrix to the bin counts to determine a first set of gradients;
   determining a second set of gradients based on a difference between the first error-type counts and the second error-type counts; and
   selecting the gradients, for the read-level voltages, from the first set of gradients or from the second set of gradients based on the results of the decoding.

16. The data storage system of claim 15, wherein applying the gradient generator matrix to the bin counts comprises:
   selecting the gradient generator matrix from gradient generator matrices based on the results of the decoding; and
   multiplying the gradient generator matrix by the bin counts to determine the first set of gradients.

17. The data storage system of claim 8, comprising:
   identifying a first set of bin identifiers for the memory cells based on the buffered data; and
   identifying a second set of bin identifiers for the memory cells based on the decoded data,
   wherein determining the cell level statistics comprises determining the cell level statistics based on the first set of bin identifiers and the second set of bin identifiers.

18. The data storage system of claim 17,
   wherein identifying the first set of bin identifiers comprises identifying the first set of bin identifiers by applying reverse gray coding to logical values of the buffered data, and
   wherein identifying the second set of bin identifiers comprises identifying the second set of bin identifiers by applying the reverse gray coding to logical values of the decoded data.

19. An apparatus, comprising:
   means for reading data from memory cells of memory;
   means for buffering the read data;
   means for decoding the read data to generate decoded data;
   means for determining whether the read data is decodable;
   means for determining cell level statistics based on the buffered data and the decoded data;
   means for determining gradients for read-level voltages associated with the memory based on results of the decoding and the cell level statistics, wherein when a first portion of the data read using one or more first read-level voltages is not decodable, a first gradient determination technique is selected for the one or more first read-level voltages, and when a second portion of the data read using one or more second read-level voltages is decodable, a second gradient determination technique, different from the first gradient determination technique, is selected for the one or more second read-level voltages; and
   means for configuring settings for the read-level voltages associated with the memory based on the determined gradients.

20. The apparatus of claim 19, wherein the first gradient determination technique is a bin balance process, and the second gradient determination technique is a decision directed process.

* * * * *